[12] United States Patent  
Pettinelli, Jr. et al.

(10) Patent No.: US 7,175,092 B2  
(45) Date of Patent: Feb. 13, 2007

(54) ANALOG-TO-DIGITAL CONVERTER WITH AUTOMATIC RANGE AND SENSITIVITY ADJUSTMENT

(75) Inventors: John A. Pettinelli, Jr., Rome, NY (US); Matthew W. Pankow, Camillus, NY (US); Joseph T. Livingston, Camillus, NY (US); Edward C. Bremer, Victor, NY (US); Timothy P. Meier, Camillus, NY (US)

(73) Assignee: Hand Held Products, Inc., Skaneateles Falls, NY (US)

( * ) Notice: Subject to any disclaimer, the term of this patent is extended or adjusted under 35 U.S.C. 154(b) by 236 days.

(21) Appl. No.: 10/842,717

(22) Filed: May 10, 2004

(65) Prior Publication Data

US 2005/0006475 A1    Jan. 13, 2005

Related U.S. Application Data

(63) Continuation of application No. 10/339,004, filed on Jan. 9, 2003, now abandoned.

(51) Int. Cl.
*G06K 7/10* (2006.01)

(52) U.S. Cl. .............................. 235/462.4; 235/472.01; 235/462.25

(58) Field of Classification Search ............ 235/462.14, 235/472.01, 454, 462.42, 462.25, 472.02, 235/472.03, 455, 462.01–462.47, 470, 494  
See application file for complete search history.

(56) References Cited

U.S. PATENT DOCUMENTS 3,582,884 A    6/1971    Shepard 3,723,970 A    3/1973    Stoller  
3,855,589 A    12/1974   Solender (Continued)

FOREIGN PATENT DOCUMENTS

NL    1013911 C2    4/2002

(Continued)

OTHER PUBLICATIONS

Bernstein, N., "Interfacing the AD22100 Temperature Sensor to a Low Cost Single-Chip Microcontroller", Analog Devices, Application Note AN-395, May 1995.

(Continued)

*Primary Examiner*—Thien M. Le  
(74) *Attorney, Agent, or Firm*—Wall Marjama & Bilinski LLP (57) ABSTRACT

The invention is a system and method for providing optimized accuracy and precision in analog-to-digital conversions of data. In an embodiment of the invention, an A/D converter is configured by setting two separately definable reference voltages that are controlled by a microprocessor. The A/D converter range is as wide as, or slightly greater than, a dynamic range of the analog signal to be converted. The microprocessor adjusts at least one reference voltage. The A/D converter receives analog signals from a sensor. The dynamic range of the signal from the sensor, or the sensor operating conditions, are used to define the reference voltages. The converted data is provided to a data processor at a rate controlled by a clocking signal. In a method according to the invention, the A/D converter is operated using the features described above. The accuracy and the precision of the converted data are thereby optimized.

49 Claims, 3 Drawing Sheets

U.S. PATENT DOCUMENTS

| | | | |
|---|---|---|---|
| 4,097,847 A | 6/1978 | Forsen et al. | |
| 4,628,532 A | 12/1986 | Stone et al. | |
| 4,646,353 A | 2/1987 | Tenge et al. | |
| 4,681,440 A * | 7/1987 | Burke et al. | 356/218 |
| 4,794,239 A | 12/1988 | Allais | |
| 4,815,118 A | 3/1989 | Acharya et al. | |
| 4,823,130 A | 4/1989 | Wright et al. | |
| 4,874,936 A | 10/1989 | Chandler et al. | |
| 4,896,029 A | 1/1990 | Chandler et al. | |
| 4,901,073 A | 2/1990 | Kibrick | |
| 4,954,972 A * | 9/1990 | Sullivan | 382/167 |
| 4,990,913 A | 2/1991 | Beauducel | |
| 4,998,010 A | 3/1991 | Chandler et al. | |
| 5,028,926 A | 7/1991 | Tokuhiro | |
| 5,053,770 A | 10/1991 | Mayer et al. | |
| 5,138,140 A | 8/1992 | Siemiatkowski et al. | |
| 5,153,418 A | 10/1992 | Batterman et al. | |
| 5,189,292 A | 2/1993 | Batterman et al. | |
| 5,223,701 A | 6/1993 | Batterman et al. | |
| 5,235,167 A | 8/1993 | Dvorkis et al. | |
| 5,270,898 A | 12/1993 | Elms et al. | |
| 5,272,323 A | 12/1993 | Martino | |
| 5,304,786 A | 4/1994 | Pavlidis et al. | |
| 5,304,787 A | 4/1994 | Wang | |
| 5,311,001 A | 5/1994 | Joseph et al. | |
| 5,329,281 A | 7/1994 | Baumgartner et al. | |
| 5,343,028 A | 8/1994 | Figarella et al. | |
| 5,363,055 A | 11/1994 | Ribner | |
| 5,378,881 A | 1/1995 | Adachi | |
| 5,412,197 A | 5/1995 | Smith | |
| 5,418,862 A | 5/1995 | Zheng et al. | |
| 5,422,470 A | 6/1995 | Kubo | |
| 5,428,211 A | 6/1995 | Zheng et al. | |
| 5,430,472 A | 7/1995 | Curry | |
| 5,477,042 A | 12/1995 | Wang | |
| 5,478,999 A | 12/1995 | Figarella et al. | |
| 5,487,115 A | 1/1996 | Surka | |
| 5,489,769 A | 2/1996 | Kubo | |
| 5,524,068 A | 6/1996 | Kacandes et al. | |
| 5,525,895 A | 6/1996 | Fishman | |
| 5,537,431 A | 7/1996 | Chen et al. | |
| 5,565,669 A | 10/1996 | Liu | |
| 5,591,955 A | 1/1997 | Laser | |
| 5,600,119 A | 2/1997 | Dvorkis et al. | |
| 5,612,524 A | 3/1997 | Sant' Anselmo et al. | |
| 5,621,203 A | 4/1997 | Swartz et al. | |
| 5,637,849 A | 6/1997 | Wang et al. | |
| 5,638,465 A | 6/1997 | Sano et al. | |
| 5,666,167 A | 9/1997 | Tults | |
| 5,698,833 A | 12/1997 | Skinger | |
| 5,710,417 A | 1/1998 | Joseph et al. | |
| 5,726,435 A | 3/1998 | Hara et al. | |
| 5,739,518 A | 4/1998 | Wang | |
| 5,751,234 A | 5/1998 | Schlotterer et al. | |
| 5,774,357 A | 6/1998 | Hoffberg et al. | |
| 5,814,801 A | 9/1998 | Wang et al. | |
| 5,815,106 A | 9/1998 | Poss et al. | |
| 5,867,004 A * | 2/1999 | Drager et al. | 318/701 |
| 5,867,594 A | 2/1999 | Cymbalski | |
| 5,867,595 A | 2/1999 | Cymbalski | |
| 5,872,354 A * | 2/1999 | Hanson | 235/462.24 |
| 5,875,108 A | 2/1999 | Hoffberg et al. | |
| 5,917,945 A | 6/1999 | Cymbalski | |
| 5,920,477 A | 7/1999 | Hoffberg et al. | |
| 5,979,763 A | 11/1999 | Wang et al. | |
| 5,995,032 A | 11/1999 | Gandy | |
| 5,995,036 A | 11/1999 | Nise et al. | |
| 6,053,407 A | 4/2000 | Wang et al. | |
| 6,064,763 A | 5/2000 | Maltsev | |
| 6,070,800 A | 6/2000 | Fujita et al. | |
| 6,082,619 A | 7/2000 | Ma et al. | |
| 6,129,278 A | 10/2000 | Wang et al. | |
| 6,176,428 B1 | 1/2001 | Joseph et al. | |
| 6,317,070 B1 | 11/2001 | Yuan | |
| 6,346,902 B1 | 2/2002 | Venes et al. | |
| 6,356,222 B1 | 3/2002 | Pratt | |
| 6,369,737 B1 * | 4/2002 | Yang et al. | 341/155 |
| 6,392,580 B1 | 5/2002 | Swanson | |
| 6,392,584 B1 | 5/2002 | Eklund | |
| 6,441,769 B1 | 8/2002 | Nagaraj | |
| 6,508,404 B2 | 1/2003 | Hecht | |
| 6,538,593 B2 * | 3/2003 | Yang et al. | 341/155 |
| 6,547,142 B1 | 4/2003 | Goren et al. | |
| 6,565,003 B1 | 5/2003 | Ma | |
| 6,672,511 B1 | 1/2004 | Shellhammer | |
| 6,678,412 B1 | 1/2004 | Shigekusa et al. | |
| 6,685,095 B2 | 2/2004 | Roustaei et al. | |
| 6,766,954 B2 * | 7/2004 | Barkan et al. | 235/462.42 |
| 6,811,085 B2 * | 11/2004 | Carlson et al. | 235/454 |
| 6,854,649 B2 * | 2/2005 | Worner et al. | 235/454 |
| 6,866,198 B2 * | 3/2005 | Patel et al. | 235/472.01 |
| 6,937,279 B1 | 8/2005 | Kim et al. | |
| 2002/0067299 A1 | 6/2002 | Clark et al. | |
| 2002/0097175 A1 | 7/2002 | Wong et al. | |
| 2002/0130799 A1 * | 9/2002 | Yang et al. | 341/138 |
| 2003/0029915 A1 * | 2/2003 | Barkan et al. | 235/454 |
| 2003/0062417 A1 * | 4/2003 | Rockstein et al. | 235/462.14 |
| 2003/0168512 A1 | 9/2003 | Longacre, Jr. et al. | |
| 2003/0222144 A1 | 12/2003 | Meier et al. | |
| 2004/0004128 A1 | 1/2004 | Pettinelli et al. | |
| 2004/0134988 A1 | 7/2004 | Pettinelli, Jr. et al. | |
| 2004/0134989 A1 | 7/2004 | Meier et al. | |
| 2004/0134990 A1 | 7/2004 | Fitch et al. | |
| 2005/0006475 A1 | 1/2005 | Pettinelli, Jr. et al. | |

FOREIGN PATENT DOCUMENTS

| | | |
|---|---|---|
| WO | WO 98/28853 A1 | 7/1998 |

OTHER PUBLICATIONS

Horn, J., "Interleaving Analog-to-Digital Converters", Burr-Brown Application Bulletin SBAA049, Jan. 1994.

Williams, J., et al., "A Standards Lab Guide 20-Bit DAC with 0.1ppm/°C Drift", Linear Technology, Application Note 86, Jan. 2001.

Howowitz, P., et al., "The Art of Electronics", pp. 621 & 622, Second Edition, Cambridge University Press, 1989.

Hnatek, E. R., "A User's Handbook of D/A and A/D Converters", John Wiley & Sons, New York, 1976, pp. 1-30 and 312-320.

Hoeschele, Jr., David F., "Analog-to-Digital/Digital-to-Analog Conversion Techniques", John Wiley & Sons, New York, 1969, pp. 355-365.

"Reference Voltage for Multiple ADC's", pp. 1-5, Maxim Integrated Products, Mar. 2002, downloaded from http://www.maxim-ic.com/appnotes.cfm/appnote number/994 on Mar. 30, 2002.

Demier, M. J., "High-Speed Analog-to-Digital Conversion", Academic Press, Inc., 1991, pp. 1-21.

* cited by examiner

ANALOG-TO-DIGITAL CONVERTER WITH AUTOMATIC RANGE AND SENSITIVITY ADJUSTMENT

CROSS REFERENCE TO RELATED APPLICATIONS

This application is a continuation of U.S. patent application Ser. No. 10/339,004, filed Jan. 9, 2003 now abandoned (U.S. Patent Publication No. U.S. 2004/0134998) the entire disclosure of which is incorporated herein by reference. This application is related to the applications enumerated below, all of which were filed with the United States Patent and Trademark Office on Jan. 9, 2003 by Express Mail, and all of which are subject to assignment to the same assignee of this application, the disclosure of each of which is incorporated herein by reference in its entirety: U.S. patent application Ser. No. 10/339,275 (U.S. Patent Publication No. U.S. 2004/0134990) entitled "Housing for an Optical Reader;" U.S. patent application Ser. No. 10/339,424 (U.S. Patent Publication No. U.S. 2004/0004128) entitled "Optical Reader System Comprising Digital Conversion Circuit;" U.S. patent application Ser. No. 10/339,439 (U.S. Patent Publication No. U.S. 2004/0134989) entitled "Decoder Board for an Optical Reader Utilizing a Plurality of Imaging Modules;" U.S. patent application Ser. No. 10/339,061 (U.S. Patent Publication No. U.S. 2003/0222144) entitled "Manufacturing Methods for a Decoder Board for an Optical Reader Utilizing a Plurality of Imaging Formats;" and U.S. patent application Ser. No. 10/339,281 (U.S. Patent Publication No. U.S. 2003/0168512) entitled "Optical Reader Having Position Responsive Decode Launch Circuit."

FIELD OF THE INVENTION

The invention relates to analog-to-digital (hereinafter "A/D") converter circuits in general and particularly to an A/D converter circuit that includes auto-ranging and least-significant-bit sensitivity optimization.

BACKGROUND OF THE INVENTION

Analog data by its very nature involves signals having dynamic ranges that change under varying conditions. The process of measuring such analog signals presents at least two problems. One problem is maintaining sufficient range to avoid artificially limiting the apparent dynamic range of the signal (e.g., "clipping"). Another problem is avoiding so large a dynamic range in the detector that the apparent signal uses only a fraction of the available range, thereby diminishing detector precision and sensitivity.

In particular, when the analog signal is to be converted to digital format for subsequent data processing, both problems individually pose significant risks in data analysis. Clipping introduces random and unknowable artifacts beyond the well-known artifacts which are introduced by converting a continuous (analog) signal to a discrete (digital) signal. Loss of sensitivity results in poor signal-to-noise ratio ("SNR") and associated difficulties in data interpretation.

A definition that relates accuracy and precision is given by Weisstein at http://mathworld.wolfram.com/Accuracy.html. The definition states that "the accuracy of a number x is given by the number of significant decimal (or other) digits to the right of the decimal point in x, [while] the precision of x is the total number of significant decimal (or other) digits."

Auto-ranging A/D data converters are known in which the digital output varies in steps, typically differing by one order of magnitude (e.g., using "floating point" amplifiers). In data converters comprising floating point amplifiers, which are exemplified by auto-ranging digital meters that provide absolute measurements, an analog signal is applied to the converter. The signal is measured and a digital signal proportional to the analog signal is generated. The digital signal is displayed in a decimal format, in which the auto-ranging capability changes the display output by one order of magnitude as the analog signal increases or decreases in magnitude, so as to display a substantially constant number of significant digits so long as the signal is within a defined range. In order to increase the apparent sensitivity of the meter, an increase in one decimal digit of output is required (e.g., from a three-and-one-half decimal digit output to a four-and-one-half decimal digit output, for example). However, an increase in a factor of ten in sensitivity requires an increase of four bits of data conversion capability, and the four bits are not optimally utilized in that only 10 of 16 possible values represented by four bits are ever used. There has been appreciable improvement in A/D (and digital-to-analog, or D/A) data conversion technology. However, there remain limits on how many bits of resolution are available in commercially available A/D converters, in particular at a reasonable price.

Various implementations of A/D converters providing automatic changes in range and resolution are described in the prior art. For example, U.S. Pat. No. 4,815,118, issued Mar. 21, 1989, U.S. Pat. No. 5,363,055, issued Nov. 8, 1994, and U.S. Pat. No. 6,392,584, issued May 21, 2002, each discloses a different approach to scaling the input signal to the A/D converter using an auto-ranging means. International Patent Application No. PCT/US97/23562, published on Jul. 2, 1998 under International Publication Number WO 98/28853, also discloses an auto-ranging A/D converter in which an input analog signal is measured, and the signal gain is reset to that future signals going into the A/D converter are accommodated.

In U.S. Pat. No. 5,329,281, issued Jul. 12, 1994, a circuit is disclosed that provides a "programmable tradeoff between bandwidth and resolution" in an A/D converter circuit. U.S. Pat. No. 5,270,898, issued Dec. 14, 1993, U.S. Pat. No. 5,525,895, issued Jun. 11, 1996, and U.S. Pat. No. 5,751,234, issued May 12, 1998, each discloses a monolithic IC that includes an on-board microprocessor, an A/D converter subsystem, and circuitry to improve the resolution of the A/D converter subsystem, including current and voltage ranging amplifiers for ranging analog input voltage and current signals.

Still another solution is described in U.S. Pat. No. 3,855,589, issued Dec. 17, 1974 to Solender, which discloses the use of a plurality of reference voltages that are generated in equal logarithmic amplitude steps. Solender applies different ones of the logarithmically spaced reference voltages during a measurement of a signal, thereby varying the quantization unit of the measurement during the course of the measurement.

A further solution is described in U.S. Pat. No. 4,823,130, issued Apr. 18, 1989 to Wright et al. Wright addresses the problem of reading the position of a butterfly valve, which moves over a range of zero degrees to 90 degrees, thereby controlling a flow of air. Wright discloses a method of extracting N+X bits of resolution from an N-bit A/D converter (where X=0, 1, or 2) in making a measurement of the absolute value of a magnitude M (e.g., an angular displacement) where the resolution changes according to angular ranges. This is a variant on conditioning an input signal by a factor of powers of 2. Wright discloses making a first analog-to-digital conversion of the magnitude M using a reference voltage difference of $V_{ref}$ applied to the reference voltage terminals of an A/D converter, observing a value X representing the number of consecutive zero bits that appear in the most significant bit positions of the converted value, and if X is not zero, reducing $V_{ref}$ by dividing with $2^X$ to produce a new reference voltage difference $V_{ref}/2^X$, applying $V_{ref}/2^X$ as the new reference voltage difference, and extracting N+X bits of resolution by performing a second conversion of the magnitude M. However, one shortcoming of this method is the abrupt change in resolution that occurs as the number of bits of precision changes, which occurs in Wright at angles of 22.5 and 45 degrees. For example, according to the disclosure of Wright, the precision of a reading at 22.4 degrees is 10 bits, while the precision of a reading at 22.6 degrees is only 9 bits.

U.S. Pat. No. 4,990,913, issued on Feb. 5, 1991 to Beauducel, describes an A/D system that uses a pre-amplifier to scale an input signal and a variable reference voltage selected from N fixed voltages, the reference voltage being applied to the A/D during conversion of the signal. The result is represented by the output of the A/D and a gain G indicative of the selected reference voltage. As an example, the N fixed reference voltages can be a stabilized voltage divided by a power of 2. The value obtained from the A/D is a mantissa, and the gain G is an exponent whereby the digital value is expressed.

U.S. Pat. No. 5,028,926, issued on Jul. 2, 1991 to Tokuhiro, describes a successive approximation A/D converter that uses a variable reference voltage in order to provide more bits of precision than the A/D converter comprises. Tokuhiro describes a series of reference voltages that differ by powers of 2, which are generated from a single fixed full scale voltage. The use of multiple clock signals to apply the various powers of the reference voltage allow attainment of a number of bits of resolution that is larger than the number of bits provided by the A/D.

U.S. Pat. No. 5,995,032, issued on Nov. 30, 1999 to Gandy, describes an A/D converter that comprises a fixed resistor ladder and a variable voltage element in series with the fixed resistor ladder for biasing the fixed resistor ladder between two voltages, $V_{top}$ and $V_{bottom}$, so as to control the reference voltages applied to an A/D converter.

U.S. Pat. No. 5,995,036, issued on Nov. 30, 1999 to Nise et al., describes a sigma A/D converter circuit that provides output having a sign bit, mantissa bits, and exponent bits. Nise describes the circuit as a modulator followed by a decimator followed by a normalizer with a programmable gain control feeding signals from the output of the normalizer to the inputs of the modulator and the decimator.

Each of the disclosed circuits provide solutions that have one or more disadvantages, including limited range capability, abrupt changes in sensitivity and/or resolution, and non-optimized resolution and sensitivity. Accordingly, there is a need for an analog-to digital converter that provides auto-ranging capability with optimized least-significant-bit sensitivity and that avoids the disadvantages of the prior art circuits.

SUMMARY OF THE INVENTION

In one aspect, the invention relates to an improved optical reader for reading decodable indicia. The improved optical reader comprises a sensor that senses an excitation carrying information representing an encoded symbol and that provides an analog signal responsive to the excitation at an output terminal; an analog-to-digital converter configured to receive the analog signal from the sensor output terminal at an analog data input terminal, and to provide optimized digital data in an N-bit representation, where N is a positive integer greater than 1, the N-bit range of the analog-to-digital converter substantially spanning a dynamic range of the excitation as sensed by the sensor; and a microprocessor that manipulates the optimized digital data, thereby providing accurate decoding of the digital data under a range of illumination conditions.

In one embodiment, the improved optical reader further comprises a display. In one embodiment, the range of illumination includes approximately 70,000 Lux to substantially zero Lux. In one embodiment, the sensor comprises a selected one of a CCD sensor having a plurality of pixels and a CMOS senor having a plurality of pixels. In one embodiment, the sensor comprises a selected one of a television camera, a digital camera, and a video camera. In one embodiment, the dynamic range of the excitation is measured temporally. In one embodiment, the dynamic range of the excitation is measured spatially.

In one embodiment, the improved optical reader further comprises an illumination source for illuminating the encoded symbol. In one embodiment, the illumination source for illuminating the encoded symbol comprises at least one LED. In one embodiment, the illumination source for illuminating the encoded symbol comprises a laser diode. In one embodiment, the illumination source for illuminating the encoded symbol comprises a scanner for scanning illumination from the illumination source across the encoded symbol.

In one embodiment, the improved optical reader further comprises an imaging system of which the sensor that senses an excitation is a component. In one embodiment, the imaging system comprises a stationary optical system. In one embodiment, the imaging system comprises a scanner for scanning illumination from the illumination source across the encoded symbol.

In one embodiment, the improved optical reader further comprises a trigger for initiating an action of the reader. In one embodiment, the improved optical reader is provided in a hand held configuration. In one embodiment, the improved optical reader in handheld configuration further comprises a trigger for initiating an action of the reader.

In one aspect, the invention features a least-significant-bit-optimized analog-to-digital converter circuit. The circuit comprises an analog-to-digital converter having a first reference voltage input terminal, a second reference voltage input terminal, an analog data input terminal, and a digital data output terminal providing data in an N-bit representation, where N is a positive integer greater than 1; a first reference voltage source that provides a first reference voltage to the first reference voltage input terminal; a second reference voltage source that provides a second reference voltage to the second reference voltage input terminal; a detector that detects an excitation and that provides an analog signal responsive to the excitation to the analog data input terminal; and a microprocessor-based controller that controls the first reference voltage and the second reference voltage; whereby the microprocessor-based controller adjusts at least one of the first and the second reference voltages to cause the N-bit range of the analog-to-digital converter to substantially span a dynamic range of the excitation as detected by the detector, thereby optimizing a value of a least-significant bit of the analog-to-digital converter with respect to the excitation.

In one embodiment, a difference between the first and the second reference voltages is a rational number times a characteristic voltage, a denominator of the rational number being a full scale value of an M-bit representation of the number of bits of at least one of a first D/A converter and a second D/A converter. In one embodiment, the analog-to-digital converter further comprises a clock signal input terminal for receipt of a clock signal that determines an N-bit data rate under control of the microprocessor-based controller. In one embodiment, the detector comprises a selected one of a CCD sensor having a plurality of pixels and a CMOS sensor having a plurality of pixels. In one embodiment, the dynamic range of the excitation is measured temporally. In one embodiment, the dynamic range of the excitation is measured spatially. In one embodiment, the analog-to-digital converter circuit further comprises a microprocessor that receives an N-bit digital output datum from the analog-to-digital converter. In one embodiment, the microprocessor that receives digital output data manipulates the digital output data to interpret an encoded symbol. In one embodiment, the microprocessor-based controller, the first reference voltage source, and the second reference voltage source are integrated in a single integrated circuit.

In one embodiment, an optical reader comprises the least-significant-bit-optimized analog-to-digital converter circuit. In one embodiment, the optical reader further comprises an illumination source for illuminating an encoded symbol. In one embodiment, the illumination source for illuminating the encoded symbol comprises at least one LED. In one embodiment, the illumination source for illuminating the encoded symbol comprises a laser diode. In one embodiment, the illumination source for illuminating the encoded symbol comprises a scanner for scanning illumination from the illumination source across the encoded symbol.

In one embodiment, the optical reader further comprises an imaging system of which the detector that detects an excitation is a component. In one embodiment, the imaging system comprises a stationary optical system. In one embodiment, the imaging system comprises a scanner for scanning illumination from the illumination source across the encoded symbol.

In one embodiment, the optical reader further comprises a trigger for initiating an action of the reader. In one embodiment, the optical reader is provided in a hand held configuration. In one embodiment, the optical reader in handheld configuration further comprises a trigger for initiating an action of the reader.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION OF THE INVENTION

A significant problem in reading decodable indicia such as bar codes and other types of symbols that can be interrogated optically is reading such symbols under widely varying lighting conditions. In practice, the lighting conditions for a reading can vary from fully acceptable lighting conditions, such as examining a parcel bearing a bar code under ambient sunlight at high noon on a clear day, to minimal lighting conditions, such as may be found in examining an unwieldy bar-coded part or parcel on the bottom shelf of a poorly lit warehouse at night. Often, it is impractical or impossible to control the lighting conditions. Nevertheless, it may be imperative to correctly read and decode one or more symbols to identify a particular object bearing the symbol.

The problem can also be understood in technical terms as the requirement to maintain suitably high levels of accuracy and precision in converting the analog signal of the light reflected from the symbol into digital data. Significant accuracy errors in performing the conversion occur when the minimum unit of expression, represented as the least-significant bit, is larger than necessary. Further errors in precision, in the form of reduced numbers of bits used to represent the value, occur when the range spanned by the converter is appreciably larger than the maximum magnitude that is to be converted, or is smaller than the maximum magnitude to be converted. In some embodiments contemplated herein, the digital data is evaluated so as to provide a suitable identification of the object bearing the symbol, or to provide an attribute associated with the object, such as a model, a price, an expiration date, or any other information about the identified object. In particular, one would like to have the same accuracy and precision from measurement to measurement independent of the lighting conditions. One would further like to have accuracy and precision that are uniform over the operating range of the measurement, without the necessity to pre- or post process signals and/or output data simply to obtain suitable accuracy and resolution. Those of ordinary skill in the data conversion arts will recognize that many other embodiments and applications of the principles of the invention disclosed herein are possible.

In general, analog phenomena do not express themselves in predetermined magnitudes, but rather as values in a continuum. By comparison, digital phenomena are defined in discreet magnitudes, (e.g., binary digits or "bits," expressed as one of 1 and 0) commonly represented by two voltages, such as "HI" and "LOW," or "on" and "off." Converting an analog signal to digital form requires that a value having a magnitude that might be expressed as an integer, a fraction, or even an irrational number, be expressed in a form where the units of expression are limited to powers of 2, including positive and negative integer powers.

One approach that can provide sufficient accuracy and precision is to use an A/D converter that provides more range and precision than needed, and to select and scale the data it provides. However, such an approach has the drawbacks of the increased cost of an A/D converter having higher resolution (e.g., providing 10 bits when only 8 bits of resolution are needed), as well as increased computational issues in the analysis of data having different ranges and different precision as expressed in bits. For example, a bar code reading taken under bright light would produce a signal that has more digits of precision than a different reading of the same bar code taken under dim light, merely because the light intensity falling on the bar code changed. In many instances, such as for reading bar codes or the like, the measurements necessary to decode the encoded information needs to be of sufficient accuracy and precision to deduce the encoded information from the recovered signal, but need not be an absolute measurement. In other embodiments that require an absolute measurement, such as determining the angular position of the butterfly valve of Wright, absolute values can be obtained by a simple post-processing calculation to scale the final results. In one embodiment, the post-processing involves the multiplication of each digital data value by the inverse of the value of a rational number multiplied by a characteristic voltage, which value is discussed at greater length hereinafter.

A solution that optimizes both the accuracy and the precision involves scaling the span of the analog full scale representation to exactly match (or very slightly exceed) the dynamic range of the signal to be measured. In the present invention, this is accomplished by applying first and second reference voltages, $V_{ref1}$ and $V_{ref2}$, having a voltage difference $V_{ref1}-V_{ref2}$, to the power inputs of an A/D converter that produce a voltage range, expressed as the absolute value of $V_{ref1}-V_{ref2}$, that is just large enough to accommodate the dynamic range of the analog data signal to be converted, which range need not be expressed as a power of 2, as a power of 10, or as any particular multiple or fraction of a specific voltage. Because of the nature of A/D converters, and of D/A converters, it is convenient, but not absolutely necessary, that the applied voltage difference $V_{ref1}-V_{ref2}$ be expressible as a rational number multiplied by a voltage value.

Heretofore, scaling the span of an A/D converter to an arbitrary value that changes with time and/or with changes in the environment has not been an easy or a convenient matter. The problem of performing such scaling relates to either or both of a circuit that can amplify analog signals using a varying arbitrary constant, and to an A/D converter that can scale its output to match arbitrary limits. A solution for these problems is disclosed herein, and embodiments of the solution, in the form of circuitry, are described.

Figure 1:
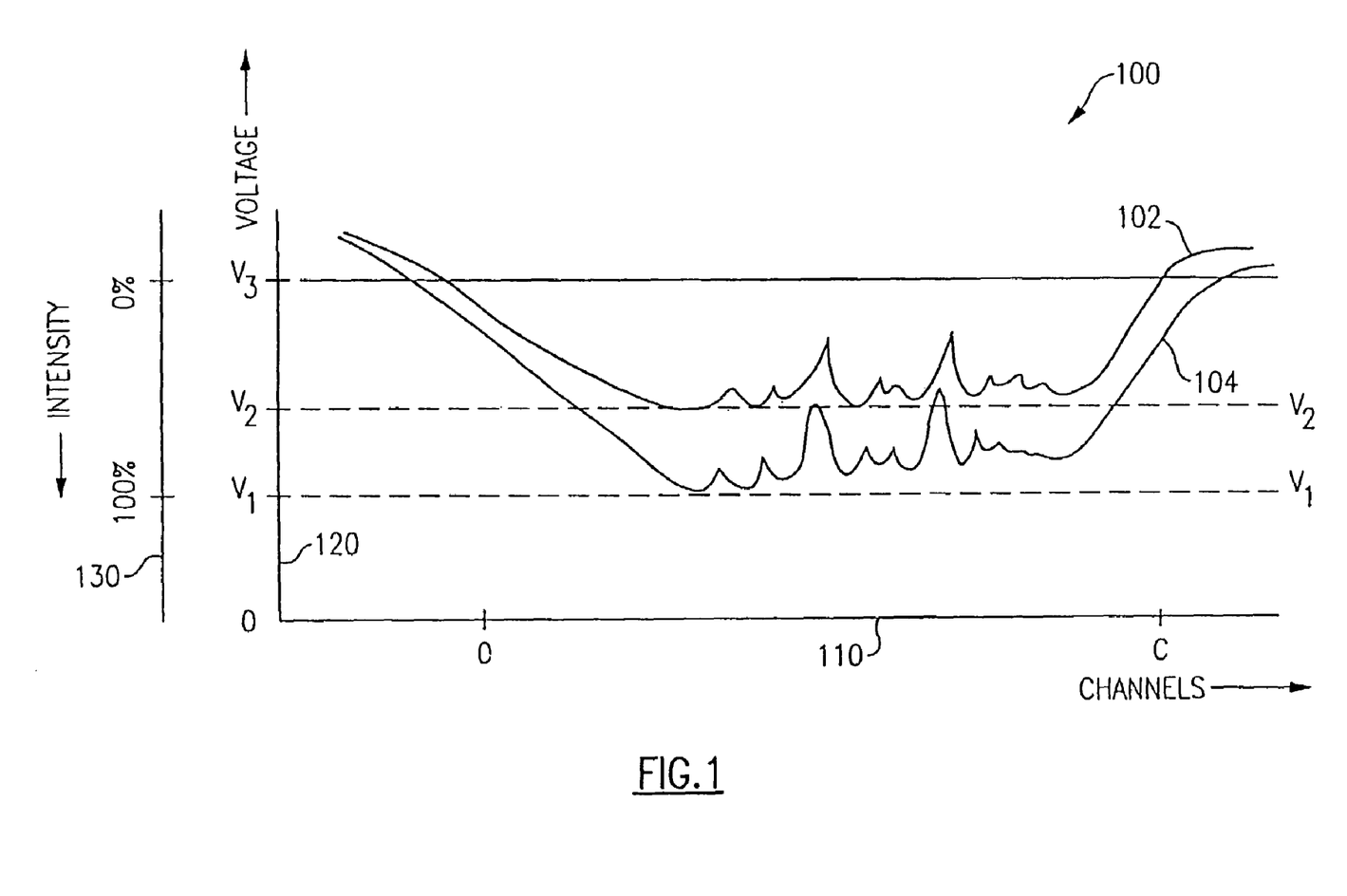
FIG. 1 is a graph that depicts exemplary embodiments of digital representations of two analog signals that vary in space along a straight line, according to the invention.

Turning to FIG. 1, a graph 100 depicts a digital representation of two analog signals 102, 104 that vary in space along a straight line. In other embodiments, the signals could equally well vary with time. The dimension 110 along which the analog signals vary may be expressed in units of measure, or may be expressed, as shown here in channel numbers, corresponding to the ordinal number of a measurement in a sequence of measurements. Here the ordinal number varies from zero (0) to a maximum channel number C, where C is a positive integer. In the embodiment described, the analog signals 102, 104 represent observations of reflections of light from a black and white pattern, such as a bar code, by each pixel of a sensor such as a CCD sensor, for example the TCD1304AP available from Toshiba of Japan, having a plurality of pixels, for example 3648 pixels.

Signal 102 represents an observation under a low light condition. Signal 104 represents an observation under stronger illumination. As indicated on the vertical axis 120 expressed in units of voltage, the CCD sensor provides a higher voltage as the intensity of the illumination is reduced. A maximum voltage, represented by $V_3$ on axis 120, which in one embodiment corresponds to 2.7 volts, is observed under conditions of minimum reflected illumination reaching the CCD sensor, such as when a pixel of the CCD sensor is observing a poorly reflective surface, such as a black portion of a bar code. A minimum voltage, represented as $V_2$ on axis 120 for signal 102, and as $V_1$ on axis 120 for signal 104, occurs when a pixel of the CCD sensor is observing a highly reflective surface, such as a white portion of a bar code. In this embodiment, under low illumination the value of $V_2$ may be 1.7 volts, while under stronger illumination, the value of $V_1$ may be 0.9 volts. Vertical axis 130 indicates the relationship of the observed light intensity to the voltages expressed on axis 120 and to the signals 102, 104. In other embodiments, the same kinds of observations can be observed for decodable indicia such as symbols having color, symbols having gray scale, symbols representing biometric information such as fingerprints, retinal patterns, or physical features such as facial features, and other types of symbols that provide an optical signal by using a suitable sensor that is sensitive to color, gray scale, or other representations of absolute or relative reflected illumination.

Figure 2:
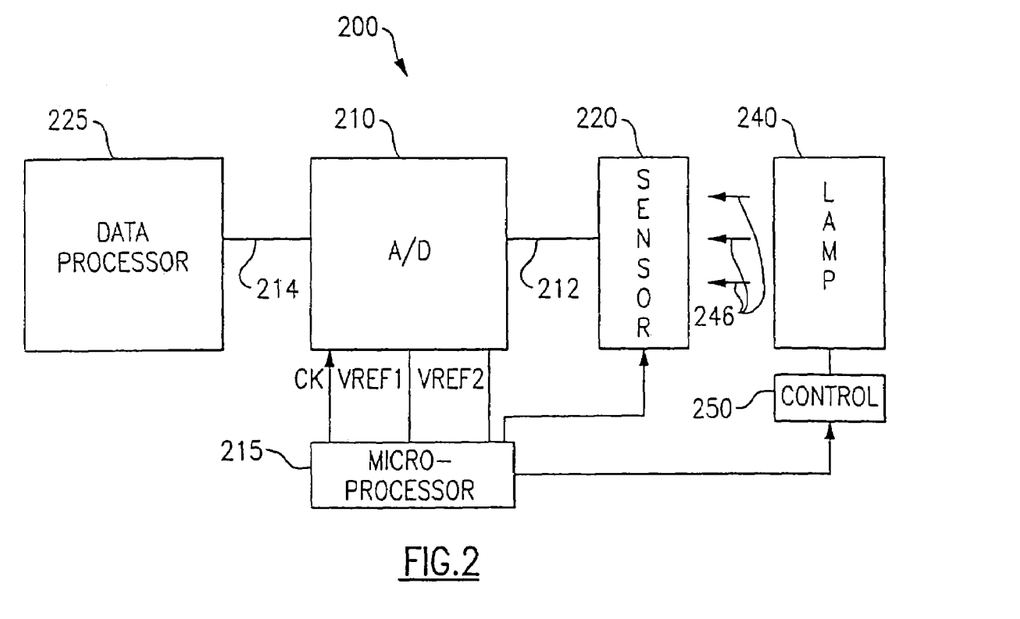
FIG. 2 illustrates an exemplary embodiment of a circuit that provides optimal accuracy and precision, according to the invention.

FIG. 2 illustrates an exemplary embodiment of a circuit 200 that provides optimal accuracy and precision in measuring and converting analog signals observed from decodable indicia such as bar codes. The circuit 200 is powered by any convenient electrical power supply, such as a battery or a power supply connected to a wall socket. Power supplies are well known and are not shown in FIG. 2. The circuit 200 includes an A/D converter 210, such as the ADC1173 from National Semiconductor that receives control signals, including clock signal CK from the microprocessor 215, as indicated by the line labeled CK. In one embodiment, the microprocessor 215 is a programmable system on a chip such as the CV8C26233-24PVI PSoC™ available from Cypress Semiconductor of Seattle, Wash. Alternatively, the microprocessor 215 can be any one of several provided by Motorola, Texas Instruments, and other manufacturers.

The microprocessor 215 also controls two reference voltage sources, which in one embodiment are incorporated into the microprocessor 215 integrated circuit chip. For example, the reference voltage sources may be individual D/A converters that are each driven by a respective digital signal under the control of the microprocessor 215. A first reference voltage source provides a first reference voltage $V_{Ref1}$ that is applied to a first reference voltage input terminal of A/D converter 210, as indicated by the line labeled VRef1. A second reference voltage source provides a second reference voltage $V_{Ref2}$ that is applied to a second reference voltage input terminal of A/D converter 210, as indicated by the line labeled VRef2. The microprocessor 215 can set each reference voltage independently of the value of the other. By way of example, using M-bit D/As where M=8, the microprocessor 215 can set the first reference voltage $V_{ref1}$ to be any of $2^M=2^8=256$ values in the range of 0 to 255 times a characteristic voltage V, and the microprocessor 215 can independently set the second reference voltage $V_{ref2}$ to be any of 256 values in the range of 0 to 255 times the same characteristic voltage V. Therefore, the difference between $V_{ref1}$ and $V_{ref2}$ will be an integer times the characteristic voltage V. In one embodiment, the characteristic voltage V is $\frac{1}{255}$ times a full scale voltage (e.g., $V_{fs}$) for the D/A converter, and the difference $V_{ref1}-V_{ref2}$ equals an integer/ 255 times $V_{fs}$, or a rational number multiplied by a voltage value, as described above. Those of ordinary skill in the digital data arts will recognize that, in the example given above, the fineness of the resolution of the reference signals is defined by the number of bits available in the D/A converter, which need not be identical to the number of bits provided by the A/D converter, but logically should be no fewer in order to accomplish the intended ends of the present invention. The D/A convert can have more bits of precision than the A/D converter, in which case the span of the A/D converter can be made arbitrarily close to, but greater than, the dynamic range of the signals to be measured. Also, as mention above, the inverse of the characteristic voltage multiplied by the rational number, or equivalently, the inverse of the difference in voltages between the two reference voltages, can be conveniently used to scale relative digital data to absolute digital data, as long as an absolute magnitude corresponding to one digital data measurement is know, for example by measuring a calibrated input signal.

The A/D converter 210 receives analog input signals at an analog input terminal 212. In one embodiment, the analog input signal comprises one or more signals from respective pixels of a sensor 220, such as a CCD sensor, that observes illuminated objects, such as bar codes under ambient or artificial illumination. In one embodiment, the CCD sensor is a TCD1304AP from Toshiba of Japan. Alternatively, the sensor 220 is an ILX526A manufactured by Sony of Japan. The sensor 220 may provide a signal directly to the A/D converter 210, or the signal may be provided by way of an optional switching circuit (not shown), such as a multiplexer (hereinafter "mux") of conventional type known in the art under the control of the microprocessor 215, with or without a sample-and-hold circuit of conventional type (also not shown). The analog signal may be controlled temporally by a clocking signal, such as clocking signal CK, from the microprocessor 215.

The A/D converter 210 receives analog input signals at an analog input terminal 212. In one embodiment, the analog input signal comprises one or more signals from respective pixels of a sensor 220, such as a CCD sensor, that observes illuminated objects, such as bar codes under ambient or artificial illumination. In one embodiment, the CCD sensor is a TCD1304AP from Toshiba of Japan. The above referenced TCD1304AP image sensor is a linear image sensor. Alternatively, the sensor 220 is an ILX526A manufactured by Sony of Japan. The sensor 220 may provide a signal directly to the A/D converter 210, or the signal may be provided by way of an optional switching circuit (not shown), such as a multiplexer (hereinafter "mux") of conventional type known in the art under the control of the microprocessor 215, with or without a sample-and-hold circuit of conventional type (also not shown). The analog signal may be controlled temporally by a clocking signal, such as clocking signal CK, from the microprocessor 215.

In one embodiment, the data processor 225 and the microprocessor 215 are the same processor, and in other embodiments they are distinct processors. Data processor 225 can be any conventional general purpose computer processing unit (CPU), programmed with suitable computer instructions, and having an associated memory, that is sufficiently powerful to manipulate the digital data in suitable time for the data analysis process. Examples of devices that can be used as data processor 225 include the Analog Devices Shark DSP, and the Texas Instruments 5510 DSP. In some embodiments, the data processor 225 and the A/D converter 210 are integrated on a single integrated circuit.

In another embodiment, optional additional components useful for testing or calibrating the circuit 200 may be present. These optional components include a source of illumination, such as a lamp 240, that provides illumination 242 that can be detected by the sensor 220. The lamp 240 optionally may be controlled by a control circuit 250 under the control of the microprocessor 215. The lamp 240 can be operated at various intensities under the control of control 250 so as to simulate different illumination levels that may be encountered in actual field operation of circuit 200. The testing and/or calibrating operation may be used in the course of manufacturing products that embody the invention, or incorporate circuits constructed or operating according to principles of the invention.

Figure 3:
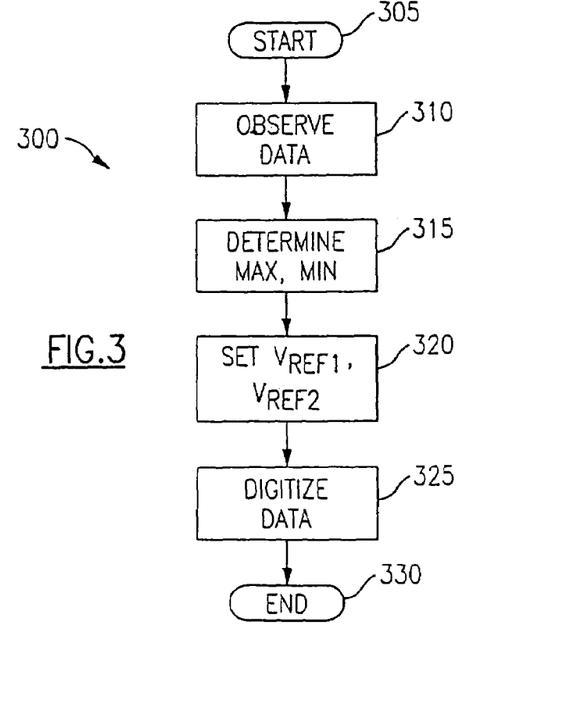
FIG. 3 is a flow diagram that schematically illustrates an analog-to-digital conversion process that operates according to principles of the invention.

FIG. 3 is a flow diagram 300 that schematically illustrates an analog-to-digital conversion process of the invention. The process starts at oval 305, labeled "START." The circuit 200 of the invention observes a quantity of analog data, as indicated by the box 310 labeled "OBSERVE DATA." The data need not be, but can be, enough data to complete a reading of a decodable symbol. If the data collected at step 310 is insufficient to provide data for decoding a decodable symbol, the full set of data can be obtained either before or after the A/D converter 210 is configured to digitize the data. Alternatively, in other embodiments, a separate measurement of the ambient lighting conditions is made, for example, using the image sensor 220, or using another illumination detector such as a light meter, for example a light meter such as any of the type of light meters used in photography, with or without averaging or weighting of the illumination signal.

There are various additional ways to measure the dynamic range of the analog excitation and/or the analog signal. In one embodiment, the data processor 225 analyzes converted image data to determine a range for the operation of the A/D converter 210, and signals the microprocessor 215 to adjust the range of operation of the A/D converter 210. In another embodiment, the sensor 220 comprises a microprocessor or other data manipulation capability, and the sensor 220 signals a range to the microprocessor 215. A color CMOS M×N pixel sensor having integrated A/D converters therein is disclosed for example in Dutch Patent No. 1,013,911. The signal from the sensor 220 can comprise a maximum and a minimum, or the signal can be an average value observed by the sensor 220. In a further embodiment, the sensor 220 can be scanned, for example under the control of microprocessor 215, and the maximum and minimum values determined. Those of ordinary skill will envision other methods of obtaining information indicative of an operating range for the A/D converter.

In one embodiment, the circuit examines the data to determine a maximum intensity (hereinafter "max") and a minimum intensity (hereinafter "min") contained in the data observed by the sensor 220, as denoted by the process step represented by box 315, labeled "DETERMINE MAX, MIN." In an alternative embodiment, a value of ambient lighting conditions observed for example by a light meter, including the "min" and the "max," can be correlated to a range of response for the A/D converter, for example using an equation, or using a lookup table in a memory, to determine the appropriate $V_{ref1}$ and $V_{ref2}$ to be applied to the respective reference voltage input terminals of A/D converter 210.

At step 320, corresponding to the box labeled "Set $V_{ref1}$, $V_{ref2}$," microprocessor 215 sets the values of $V_{ref1}$ and $V_{ref2}$ to prepare A/D converter 210 to perform conversions of the analog data from the sensor 220 at an appropriate range and sensitivity. As has already been described, the microprocessor 215 can prepare the A/D converter 210 for a suitable range of operation by holding one of $V_{ref1}$ and $V_{ref2}$ constant, and changing the value of the other of $V_{ref1}$ and $V_{ref2}$.

At step 325, the A/D converter 210 digitizes the analog data provided by sensor 220 according to clocking signals from microprocessor 215. When sufficient analog data has been converted, the process cycle is complete, as indicated by the oval 330 labeled "end."

Figure 4A:
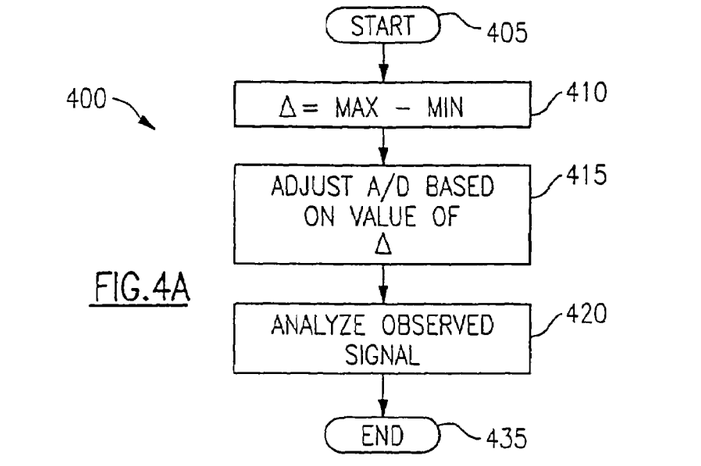
FIG. 4A is a flow diagram that schematically illustrates the steps in performing the configuration of the A/D converter in overview, according to principles of the invention.

FIG. 4A is a flow diagram 400 that schematically illustrates the steps in performing the configuration of the A/D converter in overview. In FIG. 4A, the process begins at the oval 405 labeled "START." The process includes the step of determining a value of a variable Δ=max−min, as indicated at box 410. As those of ordinary skill in the analytical arts will recognize, Δ is a measure of the dynamic range of the signal corresponding to the excitation from the encoded symbol. The process uses the value of Δ to adjust the behavior of the A/D converter, as indicated in the box 415. The process uses the adjusted A/D converter to analyze an observed signal, as indicated in the box 420.

Figure 4B:
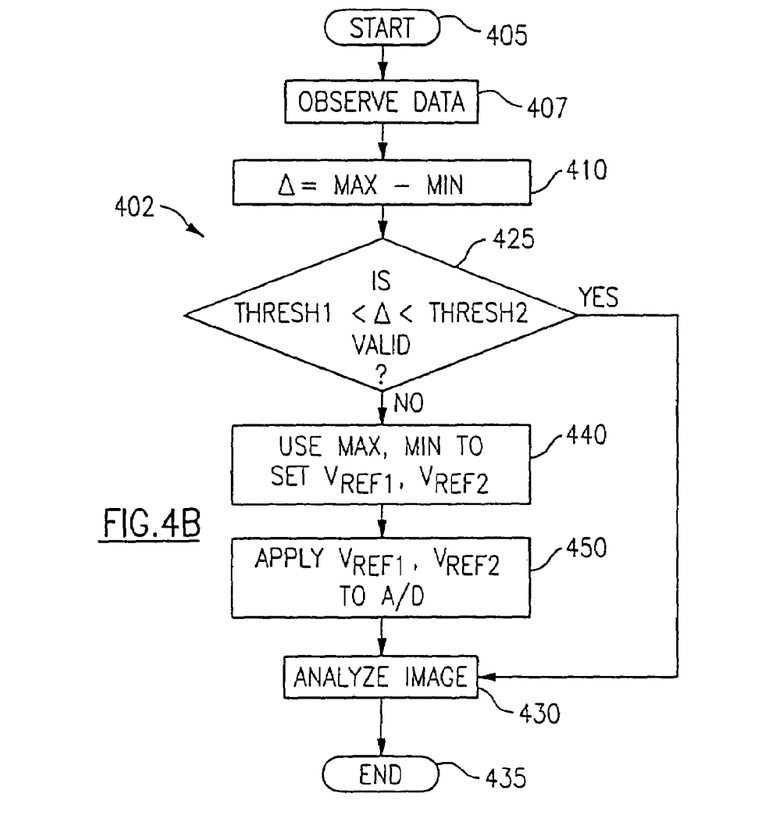
FIG. 4B is a flow diagram that illustrates one embodiment of the A/D configuration logic flow, according to principles of the invention.

FIG. 4B is a flow diagram 402 that illustrates one embodiment of the A/D configuration logic flow. In FIG. 4B, a somewhat more detailed flow logic diagram is disclosed and explained. Once again, the process starts at the oval 405 labeled "START." The system observes at least one set of observations of a symbol to be decoded. The process includes the step of determining a value of a variable Δ=max−min, as indicated at box 410. The value of Δ is then compared to two threshold values, threshold1 and threshold2, as indicated at diamond 425. In one embodiment, threshold1 is a value below which the dynamic range of the signal (e.g., the value of Δ ) is too small; that is, the value of the least significant bit of the A/D converter is too large. In one embodiment, threshold2 represents a value above which the dynamic range of the signal is too large, and the A/D converter will clip the signal at one or both extremities. If the value of Δ satisfies the relationship threshold1<Δ<threshold2, then the A/D converter is well suited to measure a signal having a dynamic range of Δ without clipping and without loss of sensitivity. Therefore, when the relationship threshold1<Δ<threshold2 is valid, an image that has been or that is about to be observed is suitable for analysis, as indicated at box 430, and the process is complete at oval 435 labeled "END." The process can of course be repeated as often as is desired.

In the event that the relationship threshold1<Δ<threshold2 is not valid, one of two conditions must hold. Either Δ<threshold1, in which case the dynamic range of the signal is too small, or threshold2<Δ, in which case the dynamic range of the signal is too large. One adjusts the A/D converter to compensate for the "error condition." In the first instance, the A/D converter is made more sensitive (i.e., the values Of $V_{ref1}$ and $V_{ref2}$ are brought closer together, by adjusting at least one of $V_{ref1}$ and $V_{ref2}$). In the second instance, the A/D converter is made to span a larger dynamic range (or is equivalently made less sensitive) by adjusting at least one of $V_{ref1}$ and $V_{ref2}$ to increase the separation of $V_{ref1}$ and $V_{ref2}$. These adjustments are indicated by the box 440 labeled "Identify Vrefs based on min and max." The values of $V_{ref1}$ and $V_{ref2}$ can be determined by calculation, by resorting to look-up tables based on prior calibration runs, or other methods of determining what values of $V_{ref1}$ and $V_{ref2}$ will cause the relationship threshold1<Δ<threshold2 to become valid. As indicated in box 450, suitable digital values based on min and max are applied to digital-to-analog converters (D/As) (i.e., a value for D/A(min) and a value for D/A(max)) so that the desired $V_{ref1}$ and $V_{ref2}$ are applied to the A/D converter. In some embodiments, as indicated above, the D/A converters are part of the microprocessor 215. In other embodiments, the D/A converters can be provided as components of the A/D converter (e.g., as discrete $V_{ref1}$ and $V_{ref2}$ input sections thereof), so that the microprocessor 215 would provide digital signals as inputs to the $V_{ref1}$ and $V_{ref2}$ ports of the A/D, rather than voltages per se. In one embodiment, the D/As receive digital signals by way of serial communication interfaces. The process then proceeds via the step of box 430 to completion as before.

A series of tabular data showing results of actual tests are presented below. The data represent an improvement in performance, such as an increase in effective working distance, for a series of conditions. In each section of the table, the leftmost column represents a feature resolution of an encoded symbol, such as a bar code resolution in mils. The first column of data represents a nominal working distance at which the reader operates at a first value of Δ, such as Δ=1.8 Volts. In the next column of data, a relative improvement in working distance compared to the nominal value is presented, for a second value of Δ, such as a nominal 1.0 Volts. The data show clear improvements for low levels of illumination. It will be understood that improvements are also possible for higher levels of illumination. However, at high levels of illumination the performance of the unoptimized reader is sufficiently good that the improvements to be gained will in general be small. The reason for the smaller improvements at high illumination levels is that there already is enough light to obtain a suitable image and to decode the image with high accuracy and precision even when the operation of the A/D converter is somewhat less than optimal. Nevertheless, there may be situations in which optimal performance even at the highest illumination levels, such as noonday sun on a clear summer day, or approximately equal to 70,000 Lux, will be required or desired. The tabular data is now presented.

| Non-Coated Window, Zero Lux | | |
|---|---|---|
| Resolution (mils) | Δ $V_{ref}$ = 1.8 Volts | Δ $V_{ref}$ = 1.0 Volts |
| 13 | 1.000 | 1.157 |
| 15 | 1.000 | 1.194 |
| 20 | 1.000 | 1.211 |
| 55 | 1.000 | 1.285 |

For the example of a non-coated window, zero Lux ambient illumination, and line resolutions in the range of 13 to 55 mils, the improvement that is realized ranges from 15.7% to 28.5%.

| Non-Coated Window, 25 Lux | | |
|---|---|---|
| Resolution (mils) | Δ $V_{ref}$ = 1.8 Volts | Δ $V_{ref}$ = 1.0 Volts |
| 13 | 1.000 | 1.043 |
| 15 | 1.000 | 1.038 |
| 20 | 1.000 | 1.214 |
| 55 | 1.000 | 1.337 |

For the example of a non-coated window, 25 Lux ambient illumination, and line resolutions in the range of 13 to 55 mils, the improvement that is realized ranges from 3.8% to 33.7%.

| Disruptive Optics, Zero Lux | | |
| --- | --- | --- |
| Resolution (mils) | $\Delta V_{ref}$ = 1.8 Volts | $\Delta V_{ref}$ = 1.0 Volts |
| 13 | 1.000 | 1.211 |
| 15 | 1.000 | 1.158 |
| 20 | 1.000 | 1.190 |
| 55 | 1.000 | 1.346 |

For the example of disruptive optics, zero Lux ambient illumination, and line resolutions in the range of 13 to 55 mils, the improvement that is realized ranges from 15.8% to 34.6%.

| Disruptive Optics, 25 Lux | | |
| --- | --- | --- |
| Resolution (mils) | $\Delta V_{ref}$ = 1.8 Volts | $\Delta V_{ref}$ = 1.0 Volts |
| 13 | 1.000 | 1.042 |
| 15 | 1.000 | 1.057 |
| 20 | 1.000 | 1.267 |
| 55 | 1.000 | 1.177 |

For the example of disruptive optics, 25 Lux ambient illumination, and line resolutions in the range of 13 to 55 mils, the improvement that is realized ranges from 4.2% to 26.7%. Therefore, as shown in the above experimental observations, in general one can expect that the application of the systems and methods of the invention provide an improved signal processing circumstance that offers the advantages of both improved accuracy and improved precision. These advantages are also observed in prototype devices that embody principles of the invention. It will be apparent to those of ordinary skill that the principles of the invention apply equally to other embodiments employing A/D converters for use in many other applications, in addition to the reading and decoding of encoded symbols such as bar codes. For example, the principles of the invention can be applied to any analog signal that is subject to a varying dynamic range, such as optical or other electromagnetic signals, audible signals, thermal signals, pressure and/or vacuum signals, and others, such as signals derived from the chemical interaction of substances with sensors.

Those of ordinary skill will recognize that many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

While the present invention has been explained with reference to the structure disclosed herein, it is not confined to the details set forth and this invention is intended to cover any modifications and changes as may come within the scope of the following claims.

What is claimed is:

1. A least-significant-bit-optimized analog-to-digital converter circuit, comprising:
    an analog-to-digital converter having a first reference voltage input terminal, a second reference voltage input terminal, an analog data input terminal, and a digital data output terminal providing data in an N-bit representation, where N is a positive integer greater than 1;
    a first reference voltage source that provides a first reference voltage to said first reference voltage input terminal;
    a second reference voltage source that provides a second reference voltage to said second reference voltage input terminal;
    a detector that detects an excitation and that provides an analog signal responsive to said excitation to said analog data input terminal; and
    a microprocessor-based controller that controls said first reference voltage and said second reference voltage;
    whereby said microprocessor-based controller adjusts at least one of said first and said second reference voltages to cause N-bit range of said analog-to-digital converter to substantially span a dynamic range of said excitation as detected by said detector, thereby optimizing a value of a least-significant bit of said analog-to-digital converter with respect to said excitation.

2. The analog-to-digital converter circuit of claim 1, wherein a difference between said first and said second reference voltages is a rational number times a characteristic voltage, a denominator of said rational number being a full scale value of an M-bit representation of the number of bits of at least one of a first D/A converter and a second D/A converter.

3. The analog-to-digital converter circuit of claim 1, wherein said analog-to-digital converter further comprises a clock signal input terminal for receipt of a clock signal that determines an N-bit data rate under control of said microprocessor-based controller.

4. The analog-to-digital converter circuit of claim 1, wherein said detector comprises a selected one of a CCD sensor having a plurality of pixels and a CMOS sensor having a plurality of pixels.

5. The analog-to-digital converter circuit of claim 1, wherein said dynamic range of said excitation is measured temporally.

6. The analog-to-digital converter circuit of claim 1, wherein said dynamic range of said excitation is measured spatially.

7. The analog-to-digital converter circuit of claim 1, further comprising a microprocessor that receives an N-bit digital output datum from said analog-to-digital converter.

8. The analog-to-digital converter circuit of claim 7, wherein said microprocessor that receives digital output data manipulates said digital output data to interpret an encoded symbol.

9. The analog-to-digital converter circuit of claim 1, wherein said microprocessor-based controller, said first reference voltage source, and said second reference voltage source are integrated in a single integrated circuit.

10. An optical reader comprising said least-significant-bit-optimized analog-to-digital converter circuit of claim 1.

11. The optical reader of claim 10, further comprising an illumination source for illuminating an encoded symbol.

12. The optical reader of claim 11, wherein said illumination source for illuminating said encoded symbol comprises at least one LED.

13. The optical reader of claim 11, wherein said illumination source for illuminating said encoded symbol comprises a laser diode.

14. The optical reader of claim 11, wherein said illumination source for illuminating said encoded symbol comprises a scanner for scanning illumination from said illumination source across said encoded symbol.

15. The optical reader of claim 10, further comprising an imaging system of which said detector that detects an excitation is a component.

16. The optical reader of claim 15, wherein said imaging system comprises a stationary optical system.

17. The optical reader of claim 15, wherein said imaging system comprises a scanner for scanning illumination from said illumination source across said encoded symbol.

18. The optical reader of claim 10, further comprising a trigger for initiating an action of said reader.

19. The optical reader of claim 10, wherein said optical reader is provided in a hand held configuration.

20. The optical reader of claim 19, further comprising a trigger for initiating an action of said reader.

21. The analog-to-digital converter circuit of claim 1, wherein said detector is an M×N sensor.

22. The analog-to-digital converter circuit of claim 1, wherein said detector is an M×N CMOS sensor.

23. The analog-to-digital converter circuit of claim 1, wherein said detector is a color M×N sensor.

24. The analog-to-digital converter circuit of claim 1, wherein said detector is a linear image sensor.

25. An improved optical reader for reading decodable indicia, comprising:
a sensor that senses an excitation carrying information representing an encoded symbol and that provides an analog signal responsive to said excitation at an output terminal;
an analog-to-digital converter configured to receive said analog signal from said sensor output terminal at an analog data input terminal, and to provide optimized digital data in an N-bit representation, where N is a positive integer greater than 1, said analog-to-digital converter being controlled so that an N-bit range of said analog-to-digital converter substantially spans a dynamic range of said excitation as sensed by said sensor; and
a microprocessor that manipulates said optimized digital data, thereby providing accurate decoding of said digital data under a range of illumination conditions.

26. The improved optical reader of claim 25, further comprising a display.

27. The improved optical reader of claim 25, wherein said range of illumination includes approximately 70,000 Lux to substantially zero Lux.

28. The improved optical reader of claim 25, wherein said sensor comprises a selected one of a CCD sensor having a plurality of pixels and a CMOS sensor having a plurality of pixels.

29. The improved optical reader of claim 25, wherein said sensor comprises a selected one of a television camera, a digital camera, and a video camera.

30. The improved optical reader of claim 25, wherein said dynamic range of said excitation is measured temporally.

31. The improved optical reader of claim 25, wherein said dynamic range of said excitation is measured spatially.

32. The improved optical reader of claim 25, further comprising an illumination source for illuminating said encoded symbol.

33. The improved optical reader of claim 32, wherein said illumination source for illuminating said encoded symbol comprises at least one LED.

34. The improved optical reader of claim 32, wherein said illumination source for illuminating said encoded symbol comprises a laser diode.

35. The improved optical reader of claim 32, wherein said illumination source for illuminating said encoded symbol comprises a scanner for scanning illumination from said illumination source across said encoded symbol.

36. The improved optical reader of claim 25, further comprising an imaging system of which said sensor that senses an excitation is a component.

37. The improved optical reader of claim 36, wherein said imaging system comprises a stationary optical system.

38. The improved optical reader of claim 36, wherein said imaging system comprises a scanner for scanning illumination from said illumination source across said encoded symbol.

39. The improved optical reader of claim 25, further comprising a trigger for initiating an action of said reader.

40. The improved optical reader of claim 25, wherein said improved optical reader is provided in a hand held configuration.

41. The improved optical reader of claim 40, further comprising a trigger for initiating an action of said reader.

42. The improved optical reader of claim 25, wherein said analog-to-digital converter is controlled responsively to a dynamic range of a signal from said sensor.

43. The improved optical reader of claim 25, wherein said analog-to-digital converter is control, responsively to operating conditions of said sensor.

44. The improved optical reader of claim 25, wherein said analog-to-digital converter is controlled with use of at least one reference voltage applied to said analog-to-digital converter.

45. The improved optical reader of claim 25, wherein said analog-to-digital converter is controlled with use of first and second reference voltages applied to said analog-to-digital converter.

46. The improved optical reader of claim 25, wherein said sensor is and M×N sensor.

47. The improved optical reader of claim 25, wherein said sensor is an M×N CMOS sensor.

48. The improved optical reader of claim 25, wherein said sensor is a color M×N sensor.

49. The improved optical reader of claim 25, wherein said sensor is a linear image sensor.

* * * * *